(12) United States Patent
Lan et al.

(10) Patent No.: US 10,948,940 B2
(45) Date of Patent: Mar. 16, 2021

(54) ADJUSTABLE AND PLUGGABLE CONTROL INTERFACE DEVICE WITH SENSOR THEREOF

(71) Applicant: Shenzhen Guanke Technologies Co., Ltd, Shenzhen (CN)

(72) Inventors: Qing Lan, Shenzhen (CN); Xuren Qiu, Shenzhen (CN); Ligen Liu, Shenzhen (CN); Shoubao Chen, Shenzhen (CN)

(73) Assignee: Shenzhen Guanke Technologies Co., Ltd, Shenzhen (CN)

( * ) Notice: Subject to any disclaimer, the term of this patent is extended or adjusted under 35 U.S.C. 154(b) by 64 days.

(21) Appl. No.: 16/233,059

(22) Filed: Dec. 26, 2018

(65) Prior Publication Data

US 2020/0183442 A1    Jun. 11, 2020

(30) Foreign Application Priority Data

Dec. 7, 2018 (CN) .......................... 201811500350.9

(51) Int. Cl.
*G05G 1/10* (2006.01)
*H05K 1/18* (2006.01)
*H05K 5/00* (2006.01)
*H05B 47/10* (2020.01)

(52) U.S. Cl.
CPC .............. *G05G 1/10* (2013.01); *H05K 1/182* (2013.01); *H05K 5/0017* (2013.01); *H05K 5/0047* (2013.01); *H05B 47/10* (2020.01); *H05K 2201/10151* (2013.01); *H05K 2201/10196* (2013.01)

(58) Field of Classification Search
CPC .......... G06N 5/04; G06N 5/046; G06F 17/30; G06F 17/30663; H02J 3/14; G05D 11/00; H04W 72/04; H04W 72/0446; H04L 67/12; H05K 2201/10151; H04N 5/232
USPC .............. 307/112, 31, 38, 66; 700/286, 284; 323/211, 295; 340/3.1
See application file for complete search history.

(56) References Cited

U.S. PATENT DOCUMENTS

| | | | | |
|---|---|---|---|---|
| 9,644,828 | B1* | 5/2017 | May ...................... | H05B 47/19 |
| 10,741,898 | B2* | 8/2020 | Liao ......................... | H01P 5/12 |
| 2003/0222588 | A1* | 12/2003 | Myron ................. | H05B 47/115 |
| | | | | 315/159 |
| 2006/0052905 | A1* | 3/2006 | Pfingsten ............. | H05K 7/1484 |
| | | | | 700/286 |
| 2013/0093332 | A1* | 4/2013 | Lee ........................ | H05B 47/13 |
| | | | | 315/154 |

(Continued)

*Primary Examiner* — Nguyen Tran
*Assistant Examiner* — Jagdeep S Dhillon
(74) *Attorney, Agent, or Firm* — Maier & Maier, PLLC

(57) ABSTRACT

An adjustable and pluggable control interface device with a sensor thereof includes a sensor and at least one adjusting member. The sensor includes a PCB, a sensing portion and at least one adjusting portion. The PCB is electrically connected to the sensing portion and the adjusting portion, respectively, and the at least one adjusting portion is configured to adjust output signals of the PCB. The at least one adjusting member is inserted into the adjusting portion for adjusting the output signals of the PCB. The structure of the present disclosure can control external lamps to light or extinguish so as to realize the functions of dimming light brightness, setting light duration, adjusting energy-saving parameters and proportion. So, such structure can be easily operated with a wide range of applications.

12 Claims, 4 Drawing Sheets

(56) References Cited

U.S. PATENT DOCUMENTS

| | | | |
|---|---|---|---|
| 2014/0233906 A1* | 8/2014 | Neskin | A01K 29/00 386/224 |
| 2015/0161515 A1* | 6/2015 | Matsuoka | G06F 16/3334 706/17 |
| 2017/0307282 A1* | 10/2017 | Jelley | F25D 17/06 |
| 2019/0132839 A1* | 5/2019 | Li | H04W 12/08 |

* cited by examiner

ADJUSTABLE AND PLUGGABLE CONTROL INTERFACE DEVICE WITH SENSOR THEREOF

CROSS-REFERENCE TO RELATED APPLICATION

This application claims the priority benefit of CN application serial no. 201811500350.9, filed Dec. 7, 2018. The entirety of the above-mentioned pant application is hereby incorporated by reference herein and made a part of specification.

BACKGROUND

1. Technical Field

The present disclosure generally relates to control devices field, and especially relates to an adjustable and pluggable control interface device with a sensor thereof.

2. Description of Related Art

A conventional lamp generally includes a lamp holder, a power supply and a lamp body. The lamp holder is connected with an external input power supply and then an external switch is controlled the lamp body to light or extinguish via the power supply, or the lamp holder is directly controlled the lamp to light and extinguish. Such control mode above mentioned is relatively simple. At the same time, because use conditions of a lamp switch are limited, the lamp control mode can't be changed if its control circuit is separately rearranged. And, the conventional lamp with dimming light brightness and setting light duration is generally integrated a control module with the lamp, but rather than being detached therebetween. Thus, the control mode of the lamp is difficult to be adjusted after the lamp is out of the factory, which includes the replacement between different types of control nodules, or between different versions of control modules with the same type. As a result, when the control module of the lamp is upgraded or the control mode is updated, the lamp needs to be replaced as a whole, or even its installation circuits should be rearranged, which causing inconvenience and high cost.

Therefore, in order to solve the problems above mentioned, a pluggable control device is designed as a switch for controlling the lamp to light or extinguish. However, such conventional pluggable control device has disadvantages below: the conventional pluggable control device can only control the lamp to be opened or be closed. It is impossible to adjust brightness of the lamp when needing to adjust its brightness, while it is also impossible to set duration of the lamp when needing to reset its light duration, thereby both control mode and usage scenario are relatively simple so that better experience of user can't be obtained. In addition, the conventional pluggable control device not only can't adjust energy-saving parameter and proportion of the lamp even after the lamp is installed, but also can't compromise energy-saving level and brightness of the lamp.

SUMMARY

The technical problems to be solved: in view of the shortcomings of the related art, the present disclosure relates to an adjustable and pluggable control interface device with a sensor thereof which can be pluggably installed on external lamps for dimming light brightness, setting light duration and adjusting energy-saving parameters and proportion.

The technical solution adopted for solving technical problems of the present disclosure is:

a sensor includes a PCB, a sensing portion and at least one adjusting portion. The PCB is electrically connected to the sensing portion and the adjusting portion, respectively, and the at least one adjusting portion is configured to adjust output signals of the PCB.

Wherein the adjusting portion includes a main body and a rotating portion received in main body to rotate relative to the main body, the output signals of the PCB can be adjusted via rotating the rotating portion.

Wherein the adjusting portion includes a least one electrical pin passing through the PCB to tightly fix with the PCB.

Wherein the PCB includes at least one supporting portion passing from an upper surface of the PCB to a bottom surface of the PCB, and simultaneously passing through the sensing portion to tightly fix the sensing portion with the PCB.

An adjustable and pluggable control interface device configured to control external lamps according to an exemplary embodiment of the present disclosure includes a sensor and at least one adjusting member. The sensor includes a sensing portion, at least one adjusting portion and a PCB electrically connected to the sensing portion and the PCB, respectively, and the at least one adjusting portion configured to adjust output signals of the PCB. The at least one adjusting member is inserted into the adjusting portion for adjusting the output signals of the PCB.

Wherein the adjusting portion includes a main body and a rotating portion received in the main body to rotate relative to the main body, the output signals of the PCB can be adjusted via rotating the rotating portion.

Wherein the adjusting portion includes at least one electrical pin passing through the PCB to tightly fix with the PCB.

Wherein the PCB includes at least one supporting portion passing from an upper surface of the PCB to a bottom surface of the PCB, and simultaneously passing through the sensing portion to tightly fix the sensing portion with the PCB.

Wherein the adjusting member includes an adjusting post and a knob, one end of the adjusting member tightly fixed with the knob and the other end of the adjusting member tightly fixed with the rotating portion.

Wherein the adjustable and pluggable control interface device further includes a housing for receiving the sensor therein, the housing including a scale and an adjusting hole, the adjusting post passing through the adjusting hole and the knob stopped at the adjusting hole.

Wherein the knob includes a projection rotated to point toward the scale to precisely control adjustment of the external lamps, and the adjusting hole includes a limiting portion configured to limit a rotation angle of the projection.

Wherein the knob includes a plurality of barbs formed on a side thereof connected to the adjusting post, the plurality of barbs clamped on the adjusting hole to adjust gear position of the knob.

Wherein the adjustable and pluggable control interface device further includes an inserting terminal passing through a portion of the housing opposite to the adjusting hole and electrically connected to the PCB, and the inserting terminal can be selected from one of an earphone plug, a USB plug and an RJ45 plug.

The present disclosure provides the advantages as below.

Firstly, the structure of the present disclosure can control external lamps to light or extinguish so as to realize the functions of dimming light brightness, setting light duration, adjusting energy-saving parameters and proportion. So, such structure can be easily operated with a wide range of applications.

Secondly, the structure of the present disclosure can still adjust energy-saving parameter and proportion of the lamp even after the lamp is installed, and also can compromise energy-saving level and brightness of the lamp, thereby a better experience can be obtained.

Thirdly, the structure of the present disclosure can be independently installed on the lamp without needing to be replaced even if the lamp is replaced, or can't need to replace the lamp when the structure of the present disclosure is upgraded, thereby the purchase cost can be effectively saved.

BRIEF DESCRIPTION OF THE DRAWINGS

Many aspects of the embodiments can be better understood with reference to the following drawings. The components in the drawings are not necessarily dawns to scale, the emphasis instead being placed upon clearly illustrating the principles of the embodiments. Moreover in the drawings, like reference numerals designate corresponding parts throughout the several views.

DETAILED DESCRIPTION

Figure 1:
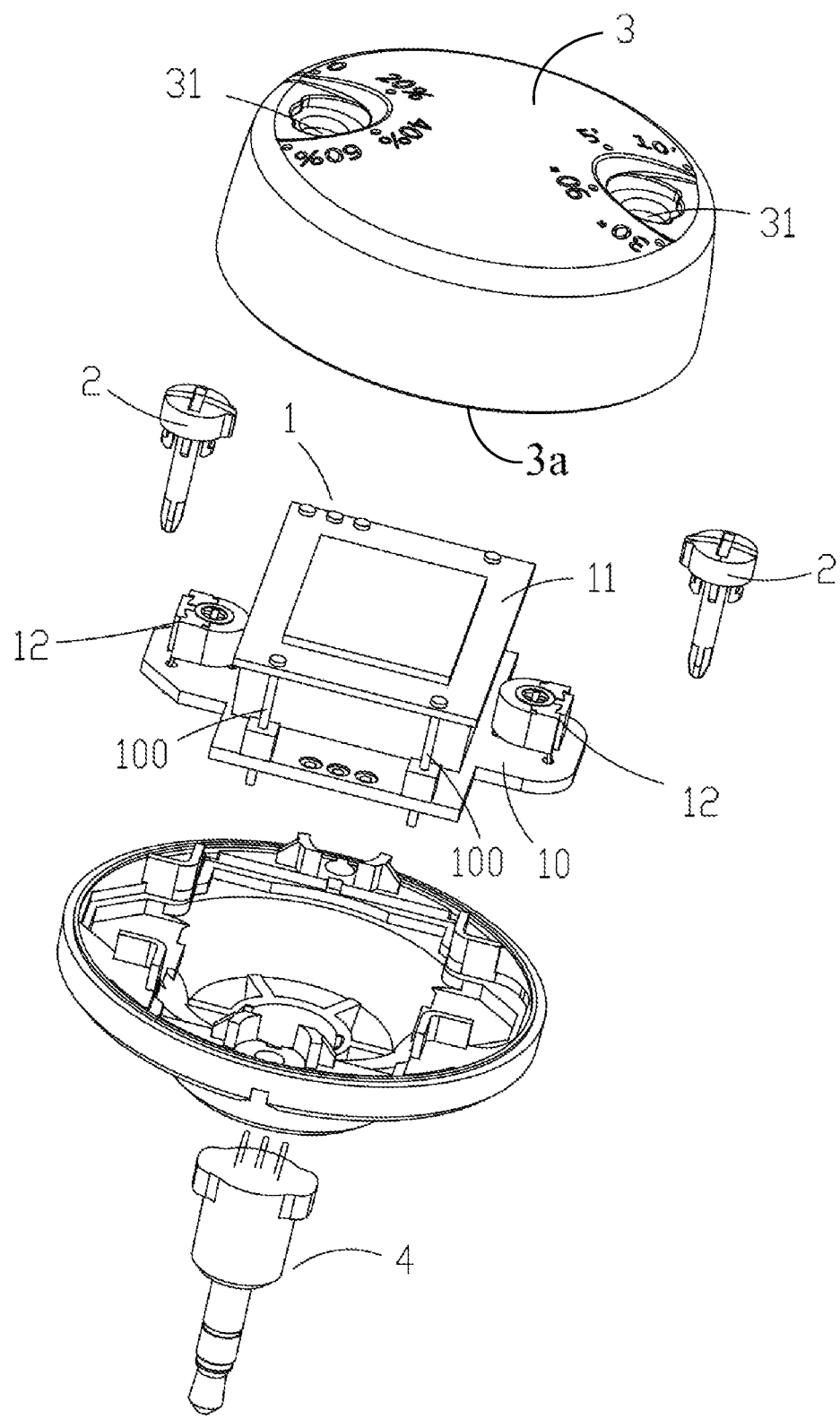
FIG. 1 is an exploded, schematic view of the adjustable and pluggable control interface device with a sensor thereof in accordance with an exemplary embodiment.

The disclosure is illustrated by way of example and not by way of limitation in the figures of the accompanying drawings, in which like reference numerals indicate similar elements.

Figure 2:
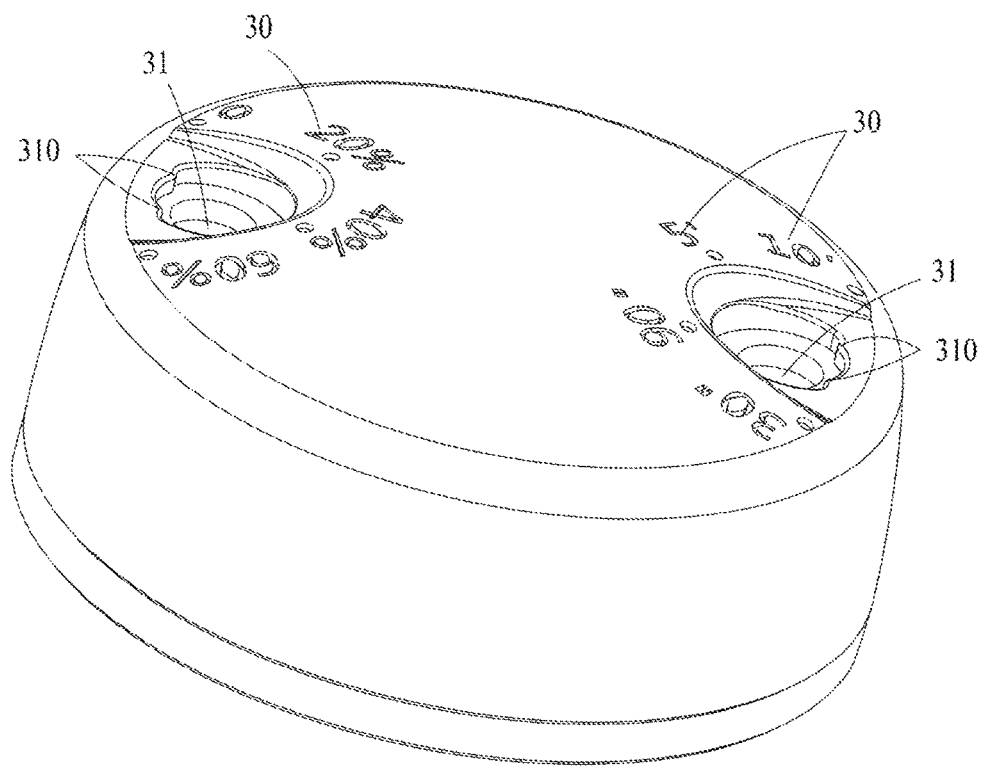
FIG. 2. is a schematic view of a housing of the adjustable and pluggable control interface device with a sensor thereof of FIG. 1.
Figure 3:
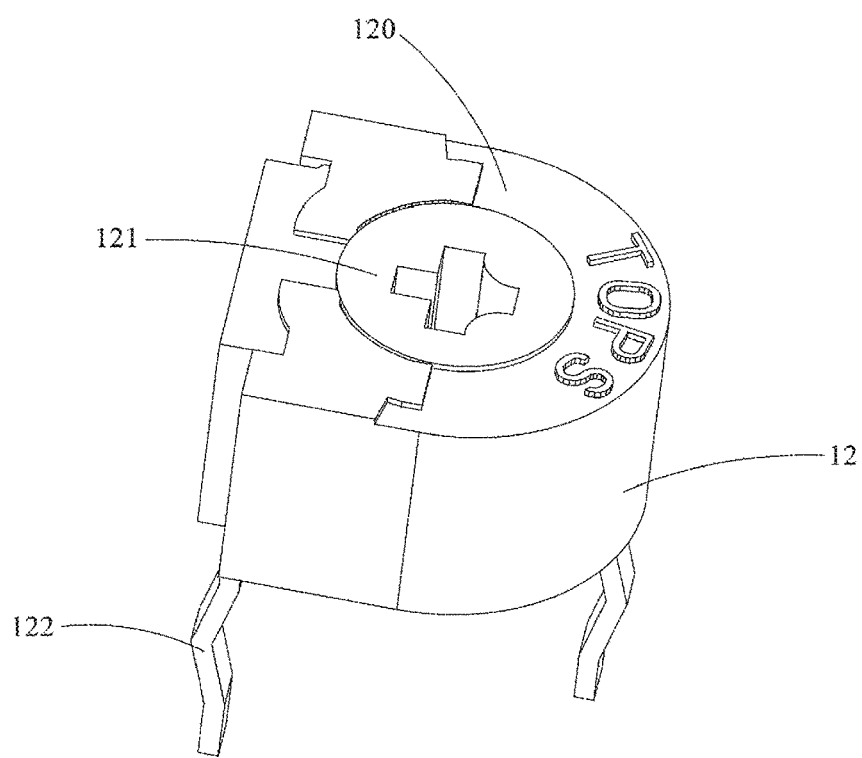
FIG. 3 is a schematic view of an adjusting portion of the adjustable and pluggable control interface device with a sensor thereof of FIG. 1.
Figure 4:
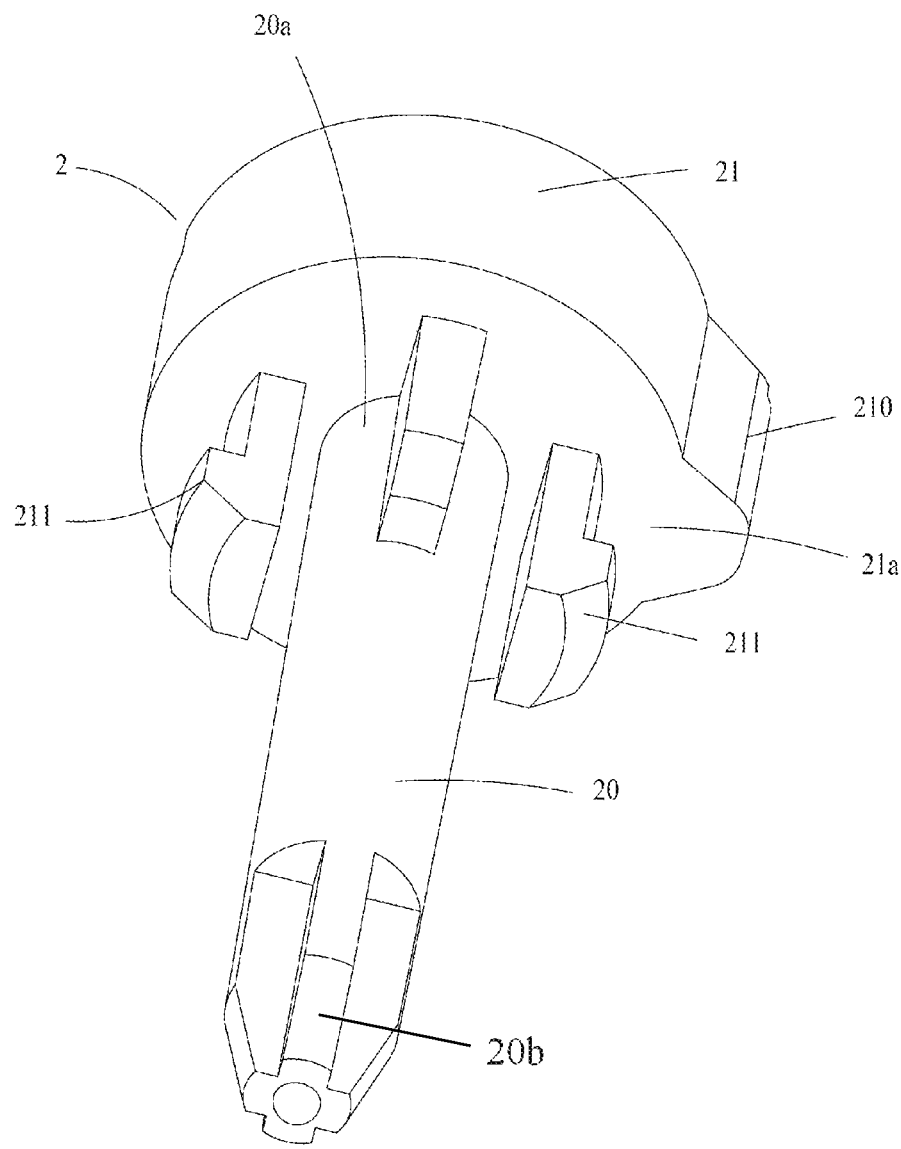
FIG. 4 is a schematic view of an adjusting member of the adjustable and pluggable control interface device with a sensor thereof of FIG. 1.
Figure 5:
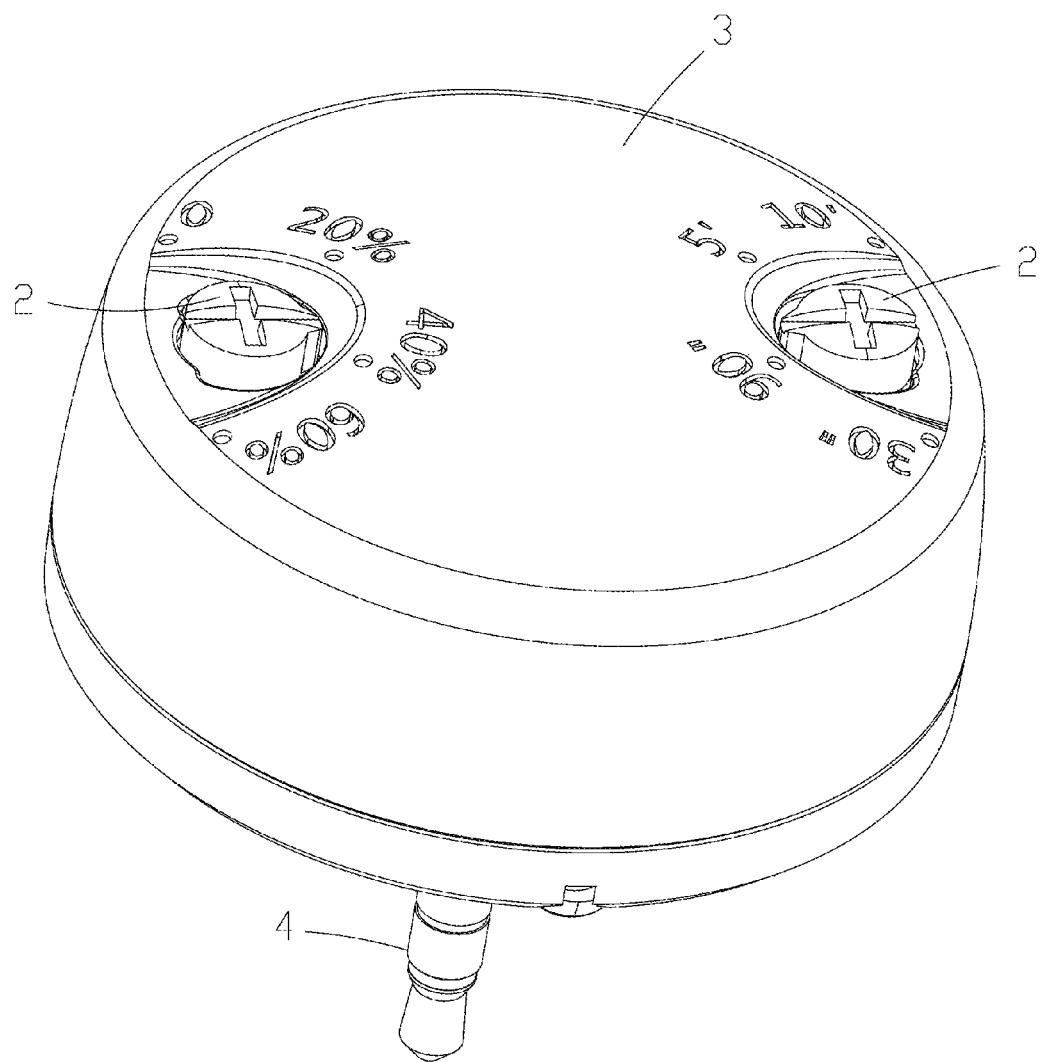
FIG. 5 is a schematic view of the adjustable and pluggable control interface device with a sensor thereof of FIG. 1.

Referring to FIGS. 1-5, a sensor 1 in accordance with an exemplary embodiment includes a PCB 10, a sensing portion 11 and at least one adjusting portion 12. The PCB 10 is electrically connected to the sensing portion 11 and the at least one adjusting portion 12, respectively. The at least one adjusting portion 12 is configured to adjust output signals of the PCB 10.

In an exemplary embodiment of the present disclosure, there is a pair of adjusting portions 12. Because the pair of adjusting portion 12 is electrically connected with the PCB 10 to adjust the output signal of the PCB 10, thereby a simple and convenient operation of the sensor 1 can be obtained.

Furthermore, the adjusting portion 12 includes a main body 120 and a rotating portion 121 received in the main body 120 to rotate relative to the main body 120. In this way, the output signals of the PCB 10 can be adjusted via rotating the rotating portion 121.

In an exemplary embodiment of the present disclosure, the adjusting portion 12 is electrically connected to the PCB 10 so that the rotating portion 121 is also electrically connected to the PCB 10, thereby the output signals of the PCB 10 can be adjusted by adjusting the rotating portion 121.

Furthermore, the adjusting portion 121 includes at least one electrical pin 122 passing through the PCB 10 to tightly fix with the PCB 10.

In an exemplary embodiment of the present disclosure, the PCB 10 is electrically connected to the adjusting portion 12 because the electrical pin 122 is electrically connected to the PCB 10.

Furthermore, the PCB 10 includes at least one supporting portion 100 passing from an upper surface 10a of the PCB 10 to a bottom surface 10b of the PCB 10, and simultaneously passing through the sensing portion 11 to tightly fix the sensing portion 11 with the PCB 10.

An adjustable and pluggable control interface device configured to control external lamps according to an exemplary embodiment of the present disclosure includes the sensor 1 above mentioned and at least one adjusting member 2. The at least one adjusting member 2 is inserted into the adjusting portion 12 for adjusting the output signals of the PCB 10.

In an exemplary embodiment of the present disclosure, the adjusting member 2 is inserted into the adjusting portion 12 so that the output signals of the PCB 10 can be adjusted by adjusting the adjusting member 2. The amount of the adjusting member 2 matched with that of the adjusting portion 12 is two. One adjusting member 2 is configured to adjust the light brightness of the lamp, and the other adjusting member 2 is configured to adjust the light duration of the lamp. When the external lamps needing to be adjusted, the adjustable and pluggable control interface device is firstly installed on the external lamp and then a corresponding adjusting member 2 is adjusted to realize the adjustment of light brightness or light duration. Furthermore, the energy-saving parameters and proportion of the external lamps can be adjusted by adjusting the adjusting member 2 according to actual needs. The energy-saving level and brightness of the external lamps can be compromised by the adjustable and pluggable control interface device so that a better experience can be obtained. In addition, such structure is not only simple to be easily operated with a wide range of applications, but also it can be used in more scenarios such as it can be independently installed on the lamp without needing to be replaced even if the lamp is replaced, or can't need to replace the lamp when it is upgraded, thereby the purchase cost can be effectively saved.

Furthermore, the adjusting member 2 includes an adjusting post 20 and a knob 21. One end 20a of the adjusting member 12 is tightly fixed with the knob 21 and the other end 20b of the adjusting member 12 is tightly fixed with the rotating portion 121.

Furthermore, the adjustable and pluggable control interface device further includes a housing 3 for receiving the sensor 1 therein. The housing 3 includes a scale 30 and an adjusting hole 31 so that the adjusting post 20 passes through the adjusting hole 31 and the knob 21 is stopped at the adjusting hole 31.

In an exemplary embodiment of the present disclosure, the knob 21 is stopped at the adjusting hole 31 so that the external lamps can be adjusted by rotating the knob 21. One scale 30 close to the one adjusting hole 31 is the brightness value, which is 0%, 20%, 40% and 60% respectively, and the other scale 30 close to the other adjusting hole 31 is the light duration, which is 5 min, 10 min, 30 min and 90 min, respectively. It can be understood that the scale 30 can be changed to other values according to actual needs, thereby an accurate adjustment of the external lamps can be obtained by accurately adjusting the value of the scale 30.

Furthermore, the knob 21 includes a projection 210 rotated to point toward the scale 30 to precisely control adjustment of external lamps, and the adjusting hole 31 includes a limiting portion 310 configured to limit a rotation angle of the projection 210.

In an exemplary embodiment of the present disclosure, the projection 210 is arranged on an edge of the knob 21 and each adjusting hole 31 includes a pair of limiting portions 310 with a convex-shaped configuration. The projection 210 can be accordingly rotated when the knob 21 is rotated. When the projection 210 is stopped rotating, the value of the scale 30 corresponding to the projection 210 is a current brightness value or a required light duration. The limiting portion 310 is configured to prevent the projection 210 from rotating at an excessive angle.

Furthermore, the knob 21 includes a plurality of barbs 211 formed on a side 21*a* thereof connected to the adjusting post 20. The plurality of barbs 211 is clamped on the adjusting hole 31 to adjust gear position of the knob 21.

In an exemplary embodiment of the present disclosure, the barb 211 is clamped on the adjusting hole 31 so that the barb 211 can be rotated with the knob 21 so as to adjust gear position of the knob 21 when the knob 21 is adjusted.

Furthermore, the adjustable and pluggable control interface device further includes an inserting terminal 4 passing through a portion 3*a* of the housing 3 opposite to the adjusting hole 31 and electrically connected to the PCB 10. The inserting terminal 4 can be selected from one of an earphone plug, a USB plug and an RJ45 plug.

In an exemplary embodiment of the present disclosure, the inserting terminal 4 is an earphone plug. It can be understood that, in other exemplary embodiment of the present disclosure, the inserting terminal 4 can be changed to any other plugs according to actual needs. The adjustable and pluggable control interface device of the present disclosure can be inserted into various external lamps with interfaces through the inserting terminal 4 so as to control the external lamps. Thus, the inserting terminal 4 has advantages of high compatibility and convenient insertion and extraction.

Although the features and elements of the present disclosure are described as embodiments in particular combinations, each feature or element can be used alone or in other various combinations within the principles of the present disclosure to the full extent indicated by the broad general meaning of the terms in which the appended claims are expressed.

What is claimed is:

1. A sensor comprising:
    a sensing portion;
    at least one adjusting portion;
    a PCB; and
    an inserting terminal, the inserting terminal being electrically connected to the PCB and selected from one of an earphone plug, a USB plug and an RJ45 plug,
    wherein the PCB is electrically connected to the sensing portion and the adjusting portion, respectively, and the at least one adjusting portion is configured to adjust output signals of the PCB,
    wherein the sensor is attachable to an external lamp via the inserting terminal, by which the sensor is connected to and controls the external lamp
    wherein the adjusting member comprises an adjusting post and a knob, one end of the adjusting member tightly fixed with the knob and the other end of the adjusting member tightly fixed with a rotating portion,
    wherein the sensor is contained within a housing, the housing comprising a scale and an adjusting hole, the adjusting hole provided opposite the inserting terminal, and
    wherein the adjusting post passes through the adjusting hole and the knob stops at the adjusting hole.

2. The sensor as claimed in claim 1, wherein the adjusting portion comprises a main body and the rotating portion received in the main body to rotate relative to the main body, the output signals of the PCB can be adjusted via rotating the rotating portion.

3. The sensor as claimed in claim 1, wherein the adjusting portion comprises at least one electrical pin passing through the PCB to tightly fix with the PCB.

4. The sensor as claimed in claim 1, wherein the PCB comprises at least one supporting portion passing from an upper surface of the PCB to a bottom surface of the PCB, and simultaneously passing through the sensing portion to tightly fix the sensing portion with the PCB.

5. An adjustable and pluggable control interface device configured to control an external lamp, comprising:
    a sensor which comprises a sensing portion, at least one adjusting portion, a PCB electrically connected to the sensing portion and the adjusting portion, respectively, and an inserting terminal,
    wherein the inserting terminal is electrically connected to the PCB and selected from one of an earphone plug, a USB plug and an RJ45 plug,
    wherein the at least one adjusting portion is configured to adjust output signals of the PCB, and
    wherein the sensor is attachable to the external lamp via the inserting terminal, by which the sensor is connected to and controls the external lamp,
    wherein the adjusting member comprises an adjusting post and a knob, one end of the adjusting member tightly fixed with the knob and the other end of the adjusting member tightly fixed with a rotating portion,
    wherein the adjustable and pluggable control interface device further comprises a housing for receiving the sensor therein, the housing comprising a scale and an adjusting hole, the adjusting hole provided opposite the inserting terminal, and
    wherein the adjusting post passes through the adjusting hole and the knob stops at the adjusting hole.

6. The adjustable and pluggable control interface device as claimed in claim 5, wherein the adjusting portion comprises a main body and the rotating portion received in the main body to rotate relative to the main body, the output signals of the PCB can be adjusted via rotating the rotating portion.

7. The adjustable and pluggable control interface device as claimed in claim 5, wherein the adjusting portion comprises at least one electrical pin passing through the PCB to tightly fix with the PCB.

8. The adjustable and pluggable control interface device as claimed in claim 5, wherein the PCB comprises at least one supporting portion passing from an upper surface of the PCB to a bottom surface of the PCB, and simultaneously passing through the sensing portion to tightly fix the sensing portion with the PCB.

9. The adjustable and pluggable control interface device as claimed in claim 5, wherein the knob comprises a projection rotated to point toward the scale to precisely control adjustment of the external lamps, and the adjusting hole comprises a limiting portion configured to limit a rotation angle of the projection.

10. The adjustable and pluggable control interface device as claimed in claim 5, wherein the knob comprises a plurality of barbs formed on a side thereof connected to the adjusting post, the plurality of barbs clamped on the adjusting hole to adjust gear position of the knob.

11. The sensor as claimed in claim 1, wherein the knob comprises a projection rotated to point toward the scale to precisely control adjustment of the external lamps, and the adjusting hole comprises a limiting portion configured to limit a rotation angle of the projection.

12. The sensor as claimed in claim 1, wherein the knob comprises a plurality of barbs formed on a side thereof connected to the adjusting post, the plurality of barbs clamped on the adjusting hole to adjust gear position of the knob.

\* \* \* \* \*